United States Patent [19]

Olego et al.

[11] Patent Number: 4,567,503
[45] Date of Patent: Jan. 28, 1986

[54] MIS DEVICE EMPLOYING ELEMENTAL PNICTIDE OR POLYPHOSPHIDE INSULATING LAYERS

[75] Inventors: Diego Olego, Croton-on-Hudson; David G. Brock, Mt. Kisco; John A. Baumann, Ossining, all of N.Y.; William E. Spicer, Stanford, Calif.

[73] Assignee: Stauffer Chemical Company, Westport, Conn.

[21] Appl. No.: 509,210

[22] Filed: Jun. 29, 1983

[51] Int. Cl.$^4$ .................. H01L 29/34; H01L 29/78; H01L 29/20; H01L 29/161

[52] U.S. Cl. .................. 357/54; 357/23.15; 357/23.2; 357/61

[58] Field of Search ............. 357/23 I, 54, 23 NS, 357/23.15, 61, 23.2

[56] References Cited

U.S. PATENT DOCUMENTS

| | | | |
|---|---|---|---|
| 3,383,567 | 5/1968 | King et al. | 357/91 |
| 3,571,673 | 3/1971 | Ovshinsky | 357/2 |
| 3,700,978 | 10/1972 | North et al. | 357/23 NS |
| 3,877,060 | 4/1975 | Shono et al. | 357/58 |
| 4,438,351 | 3/1984 | Schuermeyer | 357/23 NS |

FOREIGN PATENT DOCUMENTS

| | | | |
|---|---|---|---|
| 0125875 | 10/1981 | Japan | 357/23 I |
| 0082570 | 5/1983 | Japan | 357/23 NS |

OTHER PUBLICATIONS

Journal of Applied Physics, vol. 54, #8, Aug. 83, "Reactively . . . Sputtered AlN Films as Gate Dielectric" by Fathimulla et al.

Primary Examiner—Andrew J. James
Assistant Examiner—Mark Prenty
Attorney, Agent, or Firm—F. Eugene Davis, IV

[57] ABSTRACT

Metal-insulator-semiconductor devices are formed on III-V semiconductors utilizing a pnictide rich insulating layer. The layer may be applied by vacuum evaporation, sputtering, chemical vapor deposition, and from a liquid melt. Gallium arsenide, indium phosphide, and gallium phosphide substrates are insulated with an alkali metal high pnictide polypnictide, preferably a polyphosphide, having the formula $MP_x$ where x is equal to or greater than 15, including new forms of phosphorus grown in the presence of an alkali metal where x is much greater than 15. A $KP_{15}$ layer is preferred. They may also be insulated with a layer of a solid elemental pnictide, namely phosphorus, arsenic, antimony or bismuth applied by one of the above named processes. An elemental phosphorus layer is preferred. A silicon nitride, $Si_3N_4$, layer may be added on top of the pnictide layer to increase the breakdown voltage of the insulating layer.

16 Claims, 1 Drawing Figure

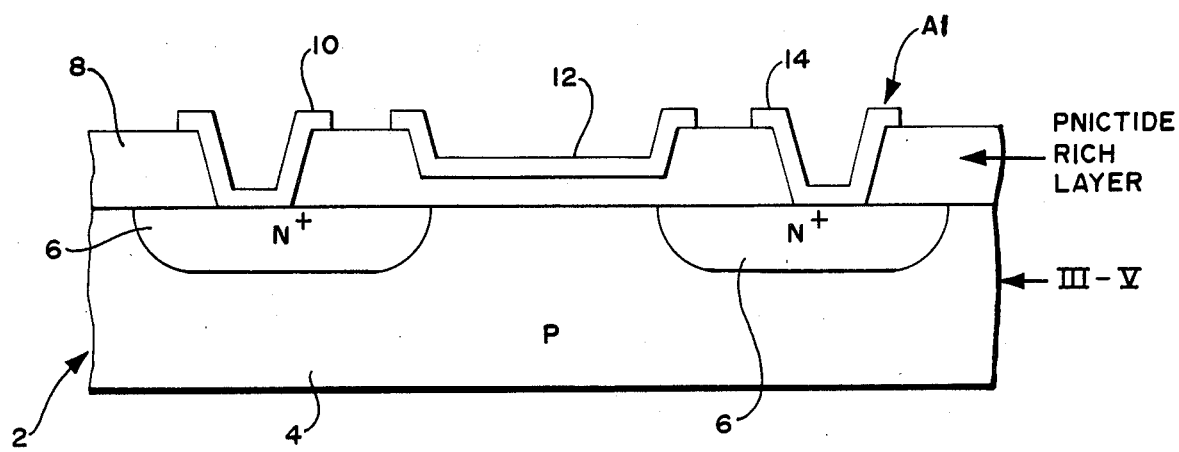

ated semiconductor materials of phosphorus, methods and apparatus for preparing and devices using them, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982; and, CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982, which is a Continuation-in-Part of Ser. Nos. 335,706 and 419,537, and now U.S. Pat. No. 4,508,931; and the applications filed herewith of Rozalie Schachter, Marcello Viscogliosi, and Lewis A. Bunz, entitled SPUTTERED SEMICONDUCTING FILMS OF CATENATED PHOSPHORUS MATERIAL AND DEVICES FORMED THEREFROM, and now U.S. Pat. No. 4,509,066; Christian G. Michel, Henry S. Marek, and John A. Baumann, entitled LIQUID PHASE GROWTH OF CRYSTALLINE POLYPHOSPHIDES; David G. Brock, and John A. Baumann, entitled VACUUM EVAPORATED FILMS OF CATENATED PHOSPHORUS MATERIAL; and, Gary K. Miller, John A Baumann, David G. Brock, and Mark A. Kuck, entitled GRAPHITE INTERCALATED ALKALI METAL VAPOR SOURCES.

TECHNICAL FIELD

This application relates to III-V semiconductors; MIS devices employing III-V semiconductors; elemental pnictide insulating layers; alkali metal high pnictide polypnictide insulating layers, particularly alkali metal polyphosphides having the formula $MP_x$ where $x$ is equal to or greater than 15; to insulating layers of new forms of pnictides particularly phosphorus grown in the presence of an alkali metal; and to methods of forming layers of these pnictide rich materials on III-V semiconductors, particularly, vacuum evaporation, sputtering, chemical vapor deposition, single and two-source vapor transport, and deposition from liquid melts.

BACKGROUND ART

III-V semiconductors have desirable properties of higher carrier mobility and lifetime than silicon. They have been successfully employed in metal semiconductor Schottky devices, but have not been employed in the more widely useful metal-insulator-semiconductor (MIS) devices. The reason for this is that the native oxides of the III-V materials do not form thermodynamically stable layers thereon in the way that silicon dioxide layers can be formed on silicon to form MIS devices. Silicon oxynitride and $Si_3N_4$ have been used as an insulating layer on III-V materials with apparently little success.

Thus it is highly desirable to find a material which readily forms an insulating layer on III-V materials and thus provide the basis for the formation of MIS devices.

DISCLOSURE OF THE INVENTION

We have discovered that insulating pnictide rich layers can be formed on III-V semiconductor substrate by every method that pnictide rich layers may be formed on any substrate. These include vacuum co-evaporation, sputtering, chemical vapor deposition, two-source vapor transport, and deposition from a liquid melt.

In particular, we have deposited an alkali metal polyphosphide layer, namely $KP_{15}$, on gallium arsenide, and gallium phosphide and Si. We have also deposited insulating layers of high x alkali metal polyphosphides having the formula $MP_x$ where $x$ is greater than 15 on these materials. For all practical purposes, such very high x materials are elemental phosphorus.

We have also deposited elemental phosphorus layers on substrates of gallium arsenide and gallium phosphide using these same processes. We fully expect that indium phosphide and other III-V semiconductors may also be used as substrates.

We contemplate that other high pnictide polypnictides, particularly alkali metal polypnictides and other elemental pnictides comprising Group V atoms will also form useful insulating layers. These pnictide materials are insulators or very high resistivity semiconductors, good film formers, and the pnictides being group V materials provide matching order and adhesion to the group V atoms of the group V containing semiconductors.

According to our invention as MIS device utilizing a III-V substrate may be formed as shown in the figure. There the III-V substrate, generally indicated at 2, is appropriately doped to form P regions 4 and N regions 6 therein. The polypnictide or elemental pnictide layer 8 is then deposited thereon, according to our invention, appropriately masked and etched, and then a metal such as aluminum is deposited to form drain 10, gate 12, and source 14. Those skilled in the art will realize that many other MIS configurations and devices may be fabricated using a pnictide rich layer according to our invention.

The insulating layers of our invention have a resistivity of greater than $10^{30\ 10}$ ohm-cm. Which is greater than the resistivity of the III-V materials.

We have successfully added another $Si_3N_4$ layer on top of a pnictide layer of III-V materials to provide a higher breakdown voltage.

OBJECTS OF THE INVENTION

It is therefore an object of the invention to provide an insulating layer for III-V semiconductors.

Another object of the invention is to provide MIS III-V semiconductor devices.

A further object of the invention is to provide methods for depositing such insulating layers and for manufacturing such MIS devices.

Other objects of the invention will in part be obvious and will in part appear in this application.

The invention accordingly comprises several steps and the relation of one or more of such steps with respect to each of the others, and the articles possessing the features, properties, and the relation of elements, which are exemplified in the following detailed disclosure. The scope of the invention is indicated in the claims.

BRIEF DESCRIPTION OF THE DRAWINGS

For a full understanding of the nature and objects of the invention reference should be made to the following detailed description taken in connection with the accompanying drawing in which the sole FIG. is a schematic diagram of a III-V MIS device according to the invention.

BEST MODE FOR CARRYING OUT THE INVENTION

Preparation Of Insulating $KP_{15}$ Films on GaP and GaAs by CVD

The chemical vapor deposition apparatus described in the above-identified previously filed U.S. Patent Application Ser. No. 442,208 filed Nov. 16, 1982, was used for the preparation of insulating films of $KP_{15}$ on GaP and GaAs.

Polished GaP and GaAs substrates were positioned on the substrate holder which was inserted into the resistance-heated reactor chamber. With an argon flow through the chamber of 340 ml/min, the temperature was raised to and maintained at approximately 300° C. The heatup period was approximately one hour.

Using separate white phosphorus and potassium sources, the reactants were vaporized and carried into the reactor in argon streams that were maintained at 300° C. and 470° C. respectively. The phosphorus to potassium atom ratio was maintained at 32. The mole fraction of phosphorus ($P_4$) entering the reactor was approximately $1 \times 10^{-2}$. The total argon flow rate was maintained at 340 ml/min.

After running for 1.0 hour, the potassium feed was stopped and the reactor allowed to cool. The phosphorus feed to the reactor was continued until it had cooled to below 150° C. The phosphorus feed was then stopped and the argon flow through the reactor continued until it had cooled to ambient temperatures. The substrates were then removed from the reactor.

Adherent, dense, films of $KP_{15}$ were found on both the GaP and GaAs substrates. The thickness of the films was about 1 micron. The films proved to be indefinitely stable in ambient air.

Preparation of Evaluating $KP_{15}$ film on III-V Materials By Liquid Phase Growth For details of this phase see the application filed herewith of Christian G. Michel, Henry S. Marek, and John A. Baumann, entitled Liquid Phase Growth of Crystalline Polyphosphides, which application is incorporated herein by reference.

In this process quartz ampules of 10 mm outside diameter and 6 mm inside diameter (in some cases 11 mm outside diameter and 9 mm outside diameter) were used. The tubes were loaded with 0.5-2.0 grams of $KP_{15}$ produced by the condensed phase process of the previously filed above-identified applications. Polished wafers of GaAs were used, with the 110 face exposed and GaP with the 111 face exposed were used as subtrates. The ampules were evacuated to $10^{-4}$ torr and sealed off.

The temperature was raised up to 655° C. The furnace was tilted to bring the melt in contact with the subtrates and cooled down to 640°. Then the furnace was titled back to the original position.

In all cases massive crystallization of $KP_{15}$ whiskers and platelets was observed. $KP_{15}$ films were grown on the substrates described above. Crystalline $KP_{15}$ platelets of $3 \times 3$ mm in size have been obtained by cleaving the grown film from the GaP and GaAs subtrates. Twodimentional growth of $KP_{15}$ films with P-face of the GaP was observed. The surface morphology of the grown layer suggests topotaxial growth and provides the basis for application of $KP_{15}$ thin films as an insulating layer for GaP and InP.

Preparation of Films of $KP_{15}$ on GaP by Sputtering

The details of this process are disclosed in the copending application of Rozalie Schachter, Marcello Viscogliosi and Lewis A. Bunz, entitled Sputtered Semiconducting Films of Caterated Phosphorus Material and Devices Formed Therefrom. That application is incorporated herein by reference.

A uniform, homogeneous and high resistance layer of $KP_{15}$ material has been deposited by RF diode sputtering process described previously (RF diode, $KP_{15}+P$ target, 2400V, 140W) onto polished and etched III-V semiconductor substrates (GaP). GaAs and InP could also be used. The film thickness can be varied from 300Å and up. These films can serve as insulating layers in MIS devices.

Preparation of Insulating Films of Crystalline P and Amorphous $KP_{15}$ by Vacuum Evaporation

EXAMPLE 1:

A Cooke high vaccum evaporator Model CVE 301 was diffusion pumped to a base pressure of less than $3 \times 10^{-5}$ torr. A resistance heated baffled boat source obtained from R. D. Mathis, containing powdered red phosphorus was resistively heated and the temperature monitored by a thermocouple. The substrates are approximately 6 inches above the sources and shielded by a movable shutter. A quartz radiant heater is used to bring the substrate temperature to 285° C. The substrates were glass, metallized glass or GaP. Two hightemperature "crackers" are used to convert the evaporating $P_4$ species to $P_2$. One is a coiled filament directly above the exit of the P source; the other is a straight wire 1" below the substrates. Both wires are resistively heated to above 1000° C. The phosphorus source is heated and a constant pressure of $8-9 \times 10^{-4}$ torr is reached as measured by a vacuum ionization gauge in the chamber. When the pressure has stabilized the shutter is moved to allow deposition of a film. A 1½ hour deposition results in a phosphorus film between 600–1300Å thick.

Several of these phosphorus films of different thicknesses were evaluated for their intrinsic electro-optical properties relevant to their use as an insulator layer in an MIS device. The films have high resistivity, greater than $10^{10}$(ohm-cm) and they are uniform, homogeneous and pinhole free down to thicknesses of 700Å. The conductivity activation energy is 1 ev. consistent with an intrinsic material with an optical gap of 2 eV as measured by transmission. The dielectric constant, obtained from capacitance measured at 1 kHz is 10 to 13. The breakdown field of a 700Å film is $6 \times 10^5$ volts per cm, while that of a 1500Å film is $10^5$ volts per cm. This breakdown field may be somewhat too low for certain MIS devices, threfore we examined a combination layer of 700Å phosphorus layer plus a 700Å $Si_3N_4$ layer. The $Si_3N_4$ layer was deposited by RF diode sputtering from a stoichiometric target and an additional source of $N_2$ introduced into the plasma. The two insulating layers are deposited in such an order that the phosphorus layer is in contact with the III-V substrate where it is important to minimize the surface state density in order to modulate the conducting channel in the device. The combination of the two layers results in a breakdown field of $6 \times 10^6$ volts per cm.

EXAMPLE 2:

An identical experimental apparatus and procedure as well used in Example 1 with the addition of a second resistively heated, independently controlled evaporation source. This baffled boat source contains $KC_8$, a graphite intercalation compound, to generate potassium vapor. This source was heated to 250° to 275° C. At the same time the phosphorus source was heated to raise the chamber pressure to $8-9 \times 10^{-4}$ torr. After both temperature and pressure are stabilized the shutter was moved. A ½ hour deposition results in a 1500 to 3000Å film of KP material.

This process is further discussed in the application of David G. Brock and John A. Baumann entitled Vacuum Evaporated Films of Catenated Phosphorus Material, filed herewith. That application is incorporated herein by reference.

We believe that these polyphosphide layers of $KP_{15}$ and $KP_x$, where x is greater than 15, will also prove useful as the I layer in MIS devices on III-V semiconductors since their electro-optical qualities are similar to the phosphorus films of Example 1.

"III-V semiconductors" as used herein means those semiconductors commonly called intermetallic or compound, formed of compounds of elements from column III and column V of the periodic table, such as aluminum phosphide, aluminum arsenide, aluminum antimonide, gallium phosphide, gallium arsenide, gallium antimonide, indium phosphide, indium arsenide and indium antimonide. By pnictide we mean those elements from column V of the periodic table, namely nitrogen, phosphorus, arsenic, antimony and bismuth.

It will thus be seen that the objects set forth above, among those made apparent from the preceding description, are efficiently obtained and, since certain changes may be made in carrying out the above methods and in the articles set forth without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly, it is to be understood that in the claims ingredients or compounds recited in the singular are intended to include compatible mixtures of such ingredients wherever the sense permits.

We claim:
1. A metal insulating semiconductor device comprising:
    a semiconductor substrate formed from a compound of III-V semiconductor material, and
    an insulating layer formed from an elemental pniotide material on said semiconductor substrate.
2. A metal insulating semiconductor device comprising:
    a semiconductor substrate formed from a compound of III-V semiconductor material, and
    an insulated layer formed from a polypniotide or said semiconductor substrate, said polypniotide being a compound formed from an alkali metal and a pniotide.
3. A metal insulating semiconductor device as claimed in claims 1 or 2 further including:
    a layer of silicon nitride on said insulating layer for providing both a second insulating layer and for increasing the breakdown voltage of said first insulating layer.
4. A metal insulating semiconductor device comprising:
    a substrate formed from a semiconductor material, and
    an insulating layer formed from an elemental pniotide material on said substrate.
5. A metal insulating semiconductor device comprising:
    a substrate formed from a semiconductor material, and an insulating layer formed from a polypniotide on said semiconductor substrate said polypniotide being a compound formed from an alkali metal and a pniotide.
6. The device as claimed in claim 4 wherein said elemental pniotide is phosphorus.
7. The device as claimed in claim 5 wherein said polypniotide is $MP_x$, where M is an alkali metal and M is in the range of 15 to infinity.
8. The device of claim 1 wherein said layer is elemental phosphorus.
9. The device of claim 2 wherein said polypniotide is a polyphosphide.
10. That which is claimed in claim 9 wherein said polyphosphide has the formula $MP_x$, where x is equal to or greater than 15.
11. That which is claimed in claim 10 wherein x is equal to 15.
12. That which is claimed in claim 10 wherein M is an alkali metal.
13. That which is claimed in claim 12 wherein x is equal to 15.
14. That which is claimed in claim 12 wherein x very much greater than 15.
15. That which is claimed in claim 11 where M is an alkali metal.
16. That which is claimed in claim 9 wherein said polyphosphide is $KP_{15}$.

* * * * *

UNITED STATES PATENT AND TRADEMARK OFFICE
CERTIFICATE OF CORRECTION

PATENT NO. : 4,567,503

DATED : January 28, 1986

INVENTOR(S) : Olego et al.

It is certified that error appears in the above-identified patent and that said Letters Patent is hereby corrected as shown below:

Col. 2, line 35, delete "as" and substitute --an--.

Col. 2, line 48, delete "$10^{30}$ $^{10}$" and substitute --$10^{+10}$--.

Col. 4, line 16, delete "Caterated" and substitute --Catenated--.

Col. 4, line 50, after "A" delete "1½2" and substitute --½--.

Col. 4, line 59, delete "ev." and substitute --eV--.

Col. 5, line 13, delete "well" and substitute --was--.

Col. 6, line 6, delete "pniotide" and substitute --pnictide--.

Col. 6, line 12, delete "polypniotide" and substitute --polypnictide--.

Col. 6, line 12, delete "or" and substitute --on--.

UNITED STATES PATENT AND TRADEMARK OFFICE
CERTIFICATE OF CORRECTION

PATENT NO. : 4,567,503

DATED : January 28, 1986

INVENTOR(S) : Olego et al.

Page 2 of 3

It is certified that error appears in the above-identified patent and that said Letters Patent is hereby corrected as shown below:

Col. 6, line 13, delete "polypniotide" and substitute --polypnictide--.

Col. 6, lines 14-15, delete "pniotide" and substitute --pnictide--.

Col. 6, line 26, delete "pniotide" and substitute --pnictide--.

Col. 6, line 31, delete "polypniotide" and substitute --polypnictide--.

Col. 6, line 32, delete "substrate" and substitute --substrate,--.

Col. 6, line 32, delete "polypniotide" and substitute --polypnictide--.

Col. 6, line 34, delete "pniotide" and substitute --pnictide--.

Col. 6, line 36, delete "pniotide" and substitute --pnictide--.

UNITED STATES PATENT AND TRADEMARK OFFICE
CERTIFICATE OF CORRECTION

PATENT NO. : 4,567,503
DATED : January 28, 1986
INVENTOR(S) : Olego et al.

It is certified that error appears in the above-identified patent and that said Letters Patent is hereby corrected as shown below:

Col. 6, line 38, delete "polypniotide" and substitute --polypnictide--.

Col. 6, line 38, after "and" delete "M" and substitute --x--.

Col. 6, line 42, delete "polypniotide" and substitute --polypnictide--.

Signed and Sealed this

Nineteenth Day of January, 1988

Attest:

DONALD J. QUIGG

Attesting Officer

Commissioner of Patents and Trademarks